United States Patent
Mizuguchi et al.

(10) Patent No.: US 10,651,068 B1
(45) Date of Patent: May 12, 2020

(54) METHOD OF MANUFACTURING SEMICONDUCTOR DEVICE BY SETTING PROCESS CHAMBER TO MAINTENANCE ENABLE STATE

(71) Applicant: KOKUSAI ELECTRIC CORPORATION, Tokyo (JP)

(72) Inventors: Yasuhiro Mizuguchi, Toyama (JP); Naofumi Ohashi, Toyama (JP); Tadashi Takasaki, Toyama (JP); Shun Matsui, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/572,690

(22) Filed: Sep. 17, 2019

(30) Foreign Application Priority Data

Jul. 23, 2019 (JP) .................. 2019-135109

(51) Int. Cl.
*H01L 21/677* (2006.01)
*H01L 21/67* (2006.01)

(52) U.S. Cl.
CPC .. *H01L 21/67745* (2013.01); *H01L 21/67023* (2013.01); *H01L 21/67253* (2013.01); *H01L 21/67754* (2013.01)

(58) Field of Classification Search
CPC ......... H01L 21/67745; H01L 21/67253; H01L 21/67754; H01L 21/67023
See application file for complete search history.

(56) References Cited

U.S. PATENT DOCUMENTS

| | | | |
|---|---|---|---|
| 6,889,110 B1* | 5/2005 | Jain | G05B 19/41865 700/100 |
| 7,043,318 B1* | 5/2006 | Barto | G06N 5/043 700/100 |
| 7,815,558 B2 | 10/2010 | Tajiri et al. | |
| 2013/0247937 A1* | 9/2013 | Nunomura | H01L 21/67109 134/18 |
| 2014/0257546 A1 | 9/2014 | Mizutani et al. | |

(Continued)

FOREIGN PATENT DOCUMENTS

| | | |
|---|---|---|
| JP | 10-270535 A | 10/1998 |
| JP | 4513102 B2 | 7/2010 |

(Continued)

*Primary Examiner* — Michael Jung
(74) *Attorney, Agent, or Firm* — Volpe and Koenig, P.C.

(57) ABSTRACT

Described herein is a technique capable of optimizing a timing of a maintenance process. According to one aspect of the technique of the present disclosure, there is provided a method of manufacturing a semiconductor device including: (a) transferring a substrate from a storage container storing one or more substrates including the substrate to a process chamber, and performing a substrate processing; (b) receiving maintenance reservation information of the process chamber; and (c) continuously performing the substrate processing after the maintenance reservation information is received in (b) until the substrate processing in the process chamber related to the maintenance reservation information is completed, and setting the process chamber to a maintenance enable state after the substrate processing is completed by stopping the one or more substrates from being transferred into the process chamber.

12 Claims, 8 Drawing Sheets

(56) References Cited

U.S. PATENT DOCUMENTS

| | | | | |
|---|---|---|---|---|
| 2016/0342147 A1* | 11/2016 | Iskandar | ............ | G05B 23/0294 |
| 2016/0365264 A1* | 12/2016 | Tokunobu | ......... | H01L 21/67017 |
| 2018/0024536 A1* | 1/2018 | Yoneda | .............. | G05B 19/4183 |
| | | | | 438/14 |

FOREIGN PATENT DOCUMENTS

| | | |
|---|---|---|
| JP | 6159536 B2 | 7/2017 |
| WO | 2013/077191 A1 | 5/2013 |

\* cited by examiner

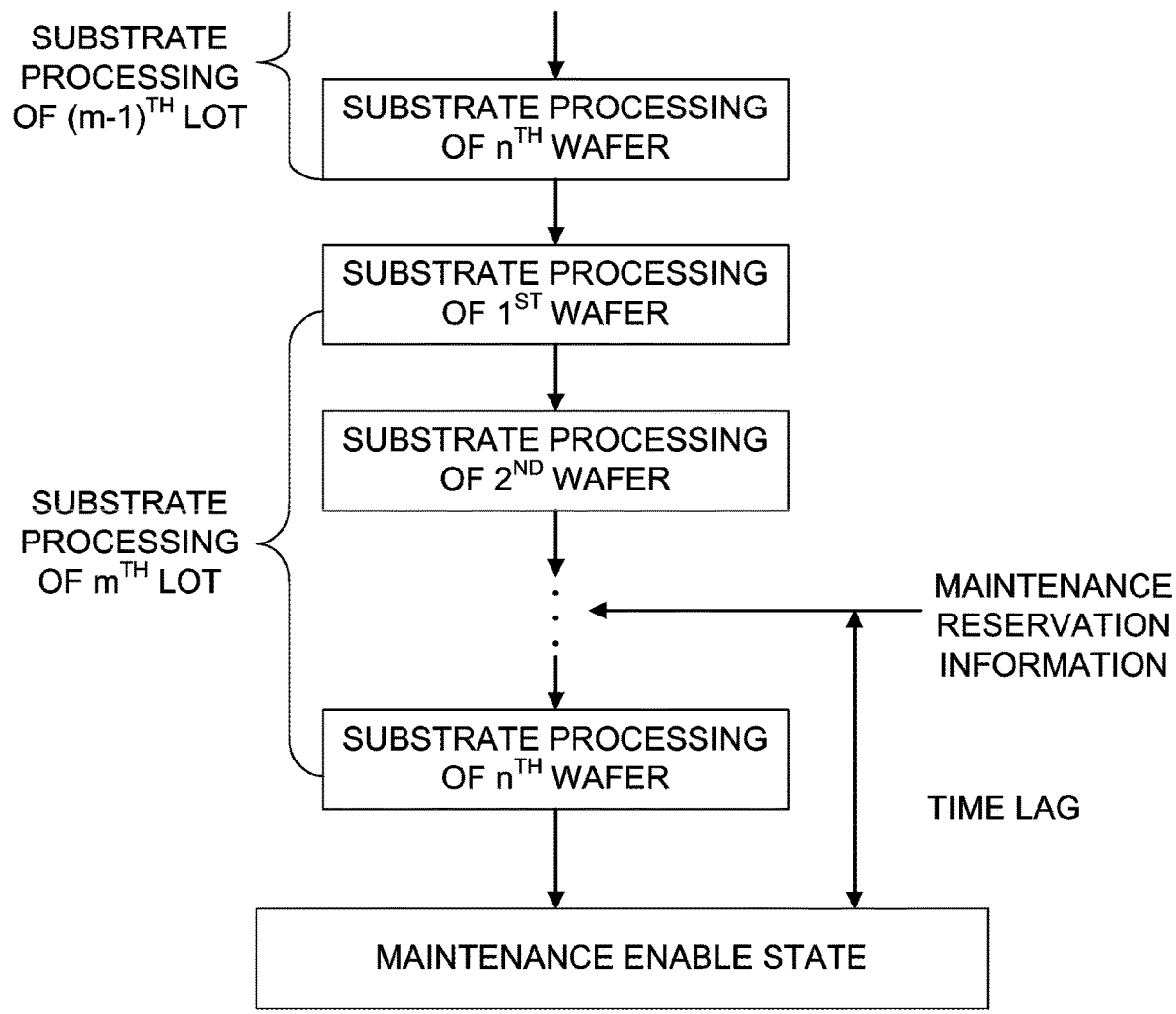

FIG. 8

| | |
|---|---|
| 1ST CONTROL MODE | - CONTINUOUSLY PERFORMING A SUBSTRATE PROCESSING UNTIL COMPLETED FOR THE SAME LOT<br>- SETTING A MAINTENANCE ENABLE STATE AFTER THE SUBSTRATE PROCESSING IS COMPLETED<br>- PERFORMING A NOTIFICATION THAT A MAINTENANCE PROCESS IS RESERVED AFTER MAINTENANCE RESERVATION INFORMATION IS RECEIVED |
| 2ND CONTROL MODE | - CHANGING A MAINTENANCE TIMING DEPENDING ON THE NUMBER OF THE UNPROCESSED WAFERS IN THE LOT BEING PROCESSED |
| 3RD CONTROL MODE | - BEING INFORMED OF A CHANGE IN THE MAINTENANCE TIMING<br>- TO ADVANCE THE MAINTENANCE TIMING, COMPLETING THE SUBSTRATE PROCESSING OF A WAFER BEING PROCESSED AND WITHDRAWING A WAFER BEING TRANSFERRED<br>- TO DELAY THE MAINTENANCE TIMING, SUBSTRATE-PROCESSING A NEXT WAFER WITHOUT SETTING THE MAINTENANCE ENABLE STATE UNTIL THE DELAYED TIMING COMES |
| 4TH CONTROL MODE | - ACCEPTING A CANCELLATION OF THE MAINTENANCE RESERVATION INFORMATION |
| 5TH CONTROL MODE | - NOTIFYING A TIME REQUIRED FOR ENTERING INTO THE MAINTENANCE ENABLE STATE BY COMPLETING THE SUBSTRATE PROCESSING |
| 6TH CONTROL MODE | - THE MAINTENANCE RESERVATION INFORMATION INCLUDING PARAMETER INFORMATION |
| 7TH CONTROL MODE | - DISTRIBUTING THE SUBSTRATE PROCESSING TO EACH SUBSTRATE PROCESSING APPARATUS |

METHOD OF MANUFACTURING SEMICONDUCTOR DEVICE BY SETTING PROCESS CHAMBER TO MAINTENANCE ENABLE STATE

CROSS-REFERENCE TO RELATED PATENT APPLICATION

This non-provisional U.S. patent application claims priority under 35 U.S.C. § 119 of Japanese Patent Application No. 2019-135109 filed on Jul. 23, 2019, in the Japanese Patent Office, the entire contents of which are hereby incorporated by reference.

BACKGROUND

1. Field

The present disclosure relates to a method of manufacturing a semiconductor device.

2. Description of the Related Art

In manufacturing processes of a semiconductor device, in order to improve the efficiency of a substrate treatment process (also referred to as a "substrate processing"), a plurality of substrates may be handled as one unit (that is, a "lot"). According to related arts, with respect to a substrate processing apparatus configured to perform the substrate processing, a technique capable of performing a maintenance process of a process space (also referred to as a "process chamber") of the substrate processing apparatus such that the substrate processing is performed without deteriorating the throughput is disclosed.

When the plurality of the substrates is handled as one lot, the processing quality of each of the plurality of the substrates may be affected depending on a timing of the maintenance process (also referred to as "maintenance timing"). For example, when the maintenance process is interposed in the middle of the substrate processing of a certain lot, the processing conditions may be changed before and after the maintenance process, and the processing quality may vary in the same lot. In addition, for example, when an execution of the maintenance process is postponed too much, the appropriate timing of the maintenance process may be missed, which may adversely affect the processing quality of the plurality of the substrates in the lot. Further, for example, when the timing of performing the maintenance process is decided by a personnel such as a maintenance operator, the burden on the maintenance operator may become excessive, and there is no guarantee that the maintenance timing can be appropriately decided.

SUMMARY

Described herein is a technique capable of optimizing a timing of a maintenance process.

According to one aspect of the technique of the present disclosure, there is provided a method of manufacturing a semiconductor device including: (a) transferring a substrate from a storage container storing one or more substrates including the substrate to a process chamber, and performing a substrate processing; (b) receiving maintenance reservation information of the process chamber; and (c) continuously performing the substrate processing after the maintenance reservation information is received in (b) until the substrate processing in the process chamber related to the maintenance reservation information is completed, and setting the process chamber to a maintenance enable state after the substrate processing is completed by stopping the one or more substrates from being transferred into the process chamber.

BRIEF DESCRIPTION OF THE DRAWINGS

FIG. 7 is a flowchart schematically illustrating an exemplary control process of a timing of a maintenance process according to the embodiments described herein.

FIG. 8 is a table schematically illustrating control modes according to the embodiments described herein.

DETAILED DESCRIPTION

Embodiments

Hereinafter, one or more embodiments (hereinafter, simply referred to as "embodiments") according to the technique of the present disclosure will be described with reference to the drawings.

In the following embodiments, a substrate processing apparatus is an example of an apparatus used in manufacturing processes of a semiconductor device. That is, the substrate processing apparatus is configured to perform a predetermined processing (also referred to as a "substrate processing") on a substrate to be processed. For example, a semiconductor wafer substrate (hereinafter, also simply referred to as a "wafer") on which a semiconductor integrated circuit device (that is, the semiconductor device) is formed may be used as the substrate to be processed. In the present specification, the term "wafer" may refer to "a wafer itself" or may refer to "a wafer and a stacked structure (aggregated structure) of predetermined layers or films formed on a surface of the wafer". That is, the term "wafer" may collectively refer to "the wafer and the layers or the films formed on the surface of the wafer. In addition, the term "surface of wafer" may refer to "a surface (exposed surface) of a wafer itself" or may refer to "a surface of a predetermined layer or film formed on the wafer, i.e. a top surface (uppermost surface) of the wafer as a stacked structure". In the present specification, the terms "substrate" and "wafer" may be used as substantially the same meaning. For example, as the substrate processing, a process such as an oxidation process, a diffusion process, a reflow process or an annealing process for planarizing or activating the carrier after the ion implantation, or a film-forming process may be performed. Specifically, the embodiments will be described by way of an example in which the film-forming process is performed as the substrate processing.

(1) Configuration of Substrate Processing System.

Figure 1:
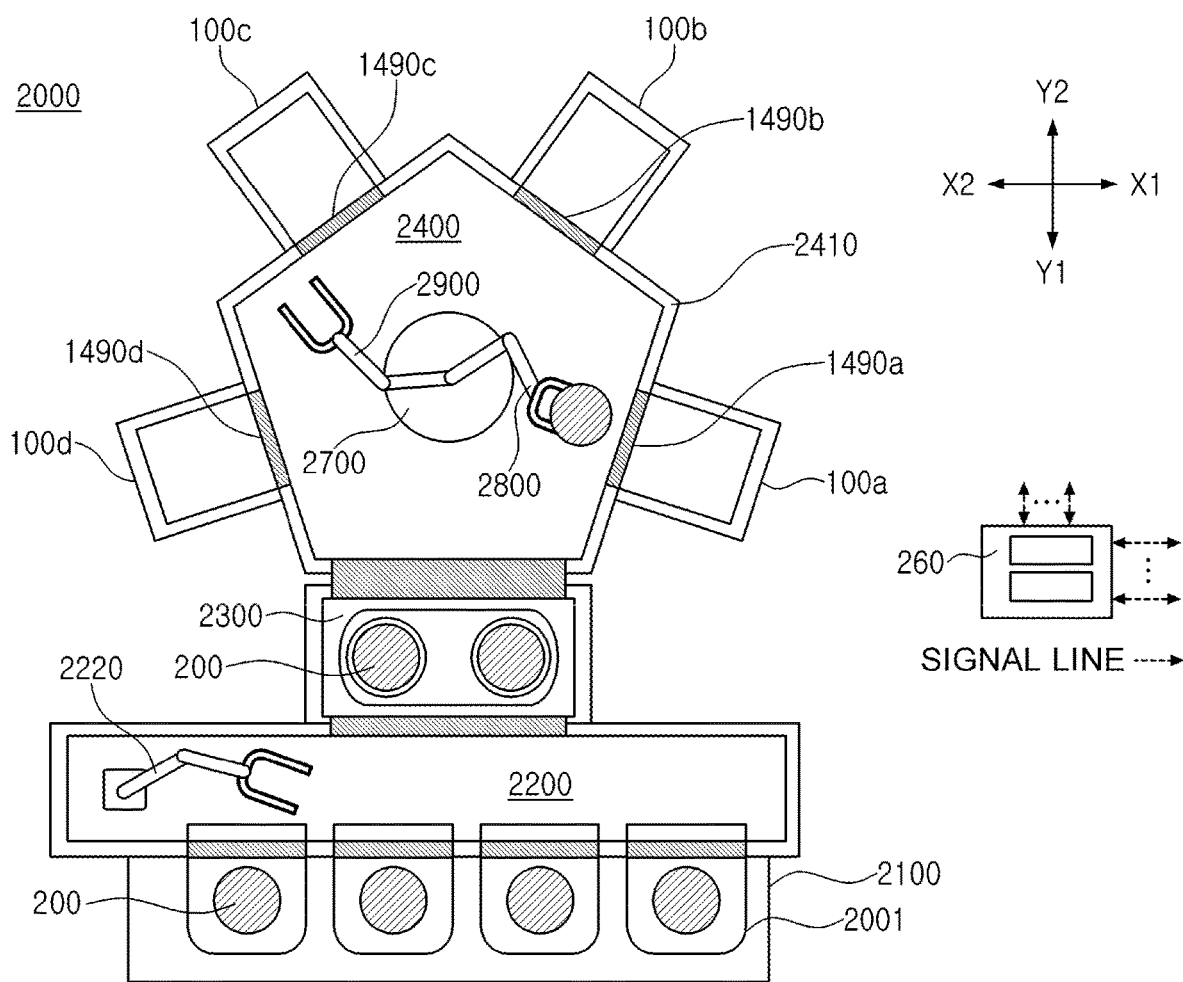
FIG. 1 schematically illustrates a horizontal cross-section of a substrate processing system preferably used in one or more embodiments described herein.

First, an exemplary configuration of the entire system including a substrate processing apparatus according to the embodiments will be described. In the present specification, the entire system including the substrate processing apparatus is also simply referred to as a "substrate processing system". FIG. 1 schematically illustrates the substrate processing system according to the embodiments.

As shown in FIG. 1, a substrate processing system 2000 to which the embodiments are applied is configured to process a plurality of wafers (or one or more wafers) including a wafer 200 serving as a substrate. The substrate processing system 2000 is a so-called cluster type apparatus having a plurality of substrate processing apparatuses. More specifically, the cluster type substrate processing system 2000 includes, for example, an I/O stage 2100, an atmospheric transfer chamber 2200, a load lock (L/L) chamber 2300, a vacuum transfer chamber 2400 and a plurality of substrate processing apparatuses (for example, substrate processing apparatuses 100*a*, 100*b*, 100*c* and 100*d*). Hereinafter, the embodiments will be an example in which the substrate processing system 2000 includes the substrate processing apparatuses 100*a*, 100*b*, 100*c* and 100*d*. However, the embodiments are not limited thereto. For example, the number of the plurality of the substrate processing apparatuses may be 5 or more or 3 or less. In the following description, front, rear, left and right directions are indicated by an arrow $Y_1$, an arrow $Y_2$, an arrow $X_2$ and an arrow $X_1$ shown in FIG. 1, respectively.

The I/O stage (also referred to as a "loading port shelf") 2100 is provided (installed) at a front side of the substrate processing system 2000. A plurality of storage containers including a storage container 2001 may be placed on the I/O stage 2100. The storage container 2001 is also referred to as a FOUP (Front Open Unified Pod) or as a pod. Hereinafter, the storage container 2001 is simply referred to as the pod 2001. The pod 2011 is used as a carrier configured to transfer the plurality of the wafers including the wafer 200. The plurality of the wafers including the wafer 200, whether processed or unprocessed, is horizontally accommodated in multiple stages in the pod 2001.

The I/O stage 2100 is provided adjacent to the atmospheric transfer chamber 2200. An atmospheric transfer robot 2220 configured to transfer the plurality of the wafers including the wafer 200 is provided in the atmospheric transfer chamber 120. The atmospheric transfer robot 2220 serves as a first transfer robot. The load lock chamber 2300 is connected to a side of the atmospheric transfer chamber 2200 other than a side to which the I/O stage 2100 is provided.

Since an inner pressure of the load lock chamber 2300 is adjusted to be equal to an inner pressure of the atmospheric transfer chamber 2200 or an inner pressure of the vacuum transfer chamber 2400 described later, a structure of the load lock chamber 2300 is capable of withstanding a negative pressure. The vacuum transfer chamber (also referred to as a "transfer module" or simply referred to as a "TM") 2400 is connected to a side of the load lock chamber 2300 other than a side to which the atmospheric transfer chamber 2200 is provided.

The TM 2400 serves as a transfer chamber constituting a transfer space in which the plurality of the wafers including the wafer 200 is transferred under the negative pressure. A housing 2410 constituting the TM 2400 is pentagonal when viewed from above. The load lock chamber 2300 and the plurality of the substrate processing apparatuses (that is, for example, the substrate processing apparatuses 100*a*, 100*b*, 100*c* and 100*d*) where the plurality of the wafers is processed are connected to each side of the pentagonal housing 2410. A vacuum transfer robot 2700 configured to transfer the plurality of the wafers under the negative pressure is provided at approximately a center of the PM 2400. The vacuum transfer robot 2700 serves as a second transfer robot. In the embodiments, a shape of the vacuum transfer chamber 2400 is exemplified as pentagonal. However, the shape of the vacuum transfer chamber 2400 is not limited thereto. For example, the shape of the vacuum transfer chamber 2400 may be polygonal such as quadrilateral and hexagonal.

The vacuum transfer robot 2700 provided in the TM 2400 includes two arms 2800 and 2900 that can be independently operated. The vacuum transfer robot 2700 is controlled by a controller 260 described later.

As shown in FIG. 1, a plurality of gate valves (GVs) (for example, gate valves 1490*a*, 1490*b*, 1490*c* and 1490*d*) is provided to correspond to the plurality of the substrate processing apparatuses (that is, the substrate processing apparatuses 100*a*, 100*b*, 100*c* and 100*d*). Specifically, a gate valve 1490*a* is provided at the substrate processing apparatus 100*a* between the substrate processing apparatus 100*a* and the TM 2400, the gate valve 1490*b* is provided at the substrate processing apparatus 100*b* between the substrate processing apparatus 100*b* and the TM 2400, the gate valve 1490*c* is provided at the substrate processing apparatus 100*c* between the substrate processing apparatus 100*c* and the TM 2400, and the gate valve 1490*d* is provided at the substrate processing apparatus 100*d* between the substrate processing apparatus 100*d* and the TM 2400. Each of the substrate processing apparatuses 100*a*, 100*b*, 100*c* and 100*d* is provided with a substrate loading/unloading port 1480. By opening/closing the substrate loading/unloading port 1480 of the substrate processing apparatuses 100*a*, 100*b*, 100*c* and 100*d* by each of the gate valves 1490*a*, 1490*b*, 1490*c* and 1490*d*, respectively, the wafer 200 can be transferred between the vacuum transfer chamber 2400 and each of the substrate processing apparatuses 100*a*, 100*b*, 100*c* and 100*d* by the vacuum transport robot 2700 in the TM 2400 via the substrate loading/unloading port 1480 of the substrate processing apparatuses 100*a*, 100*b*, 100*c* and 100*d*, respectively. Since the configuration of the gate valves 1490*a*, 1490*b*, 1490*c* and 1490*d* are the same, in the following description, the gate valves 1490*a*, 1490*b*, 1490*c* and 1490*d* may be collectively or individually referred to as a gate valve 1490.

(2) Configuration of Substrate Processing Apparatus

Hereinafter, the substrate processing apparatus 100*a*, 100*b*, 100*c* and 100*d* used in the substrate processing system 2000 described above will be described. Since the configuration of the substrate processing apparatus 100*a* through the substrate processing apparatus 100*d* are the same, in the following description, the substrate processing apparatus 100*a*, 100*b*, 100*c* and 100*d* may be collectively or individually referred to as a substrate processing apparatus 100.

Figure 2:
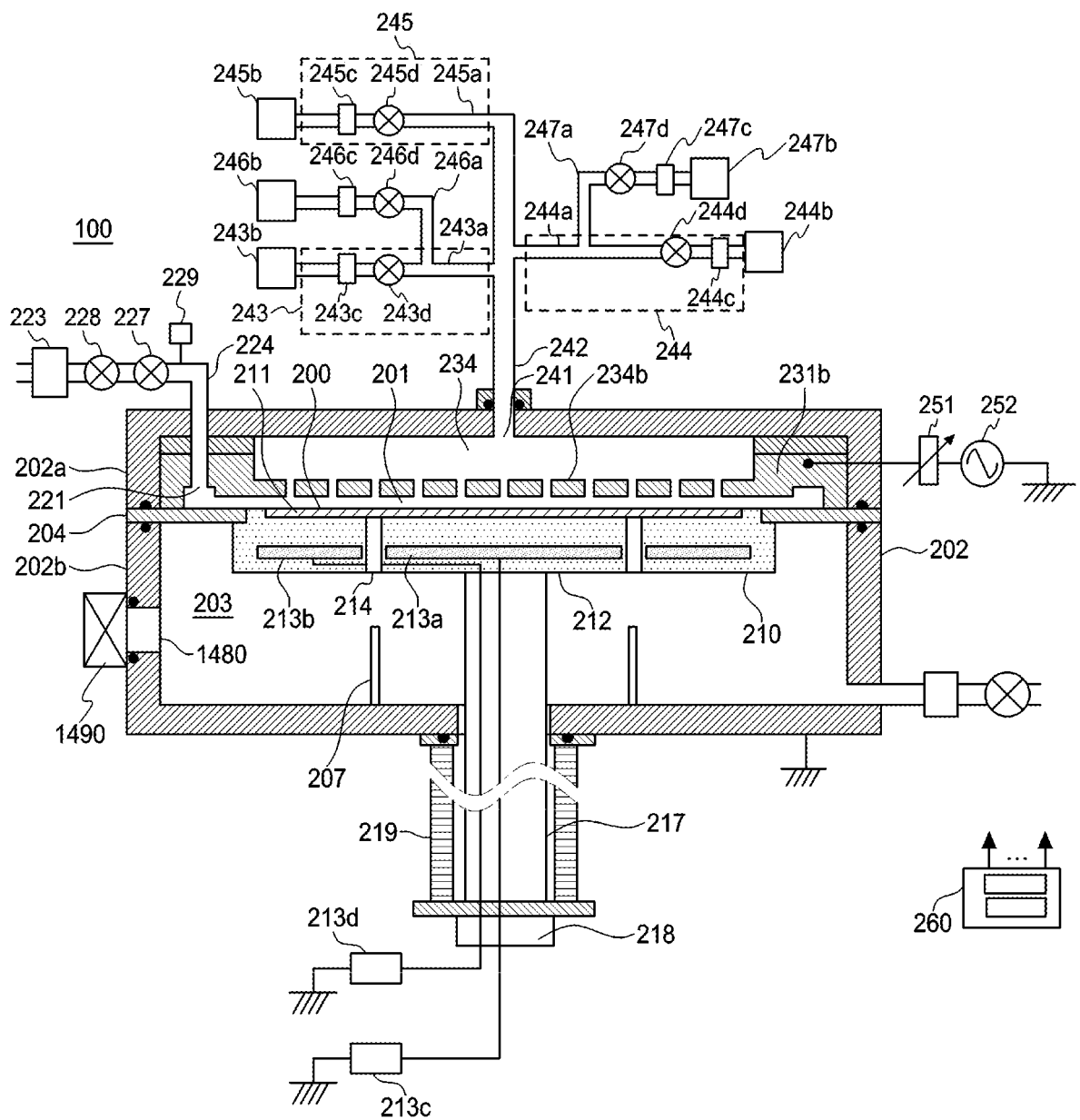
FIG. 2 schematically illustrates a vertical cross-section of the substrate processing apparatus preferably used in the embodiments described herein.

The substrate processing apparatus 100 is used when performing a film-forming process (also referred to as the "substrate processing") as a part of the manufacturing processes of the semiconductor device. For example, the substrate processing apparatus 100 is configured as a single-wafer type substrate processing apparatus. FIG. 2 schematically illustrates a vertical cross-section of the substrate processing apparatus 100 preferably used in the embodiments described herein.

<Process Vessel>

As shown in FIG. 2, the substrate processing apparatus 100 includes a process vessel 202. For example, the process vessel 202 is a flat and sealed vessel with a circular horizontal cross-section. The process vessel 202 is made of a metal material such as aluminum (Al) and stainless steel (SUS) or quartz. The process vessel 202 is constituted by an upper vessel 202a and a lower vessel 202b. A partition part (also referred to as a "partition plate") 204 is provided between the upper vessel 202a and the lower vessel 202b. A space surrounded by the upper vessel 202a and above the partition part 204 is referred to as a process space (also referred to as a "process chamber") 201. The wafer 200 to be processed by the film-forming process is processed in the process space 201. A space surrounded by the lower vessel 202b and below the partition part 204 is referred to as a transfer space (also referred to as a "transfer chamber") 203 through which the wafer 200 is transferred. The substrate loading/unloading port 1480 is provided on a side surface of the lower vessel 202b adjacent to the gate valve 1490 so that the space surrounded by the lower vessel 202b functions as the transfer chamber 203. The wafer 200 is moved (transferred) between the TM 2400 and the transfer chamber 203 through the substrate loading/unloading port 1480. Lift pins 207 are provided at a bottom of the lower vessel 202b. The lower vessel 202b is electrically grounded.

<Substrate Support>

A substrate support (also referred to as a "susceptor") 210 capable of supporting the wafer 200 is provided in the process chamber 201. The susceptor 210 includes a substrate support table 212 having a substrate placing surface 211 on which the wafer 200 is placed. The substrate support table 212 is at least provided with heaters 213a and 213b capable of adjusting (that is, heating or cooling) a temperature of the wafer 200 placed on the substrate placing surface 211. The heaters 213a and 213b are embedded in the substrate support table 212. The heaters 213a and 213b are individually connected to temperature controllers (also referred to as temperature adjusting devices) 213c and 213d capable of adjusting the power supplied to the heaters 213a and 213b, respectively. Each of the temperature controllers 213c and 213d is independently controlled in accordance with an instruction from the controller 260 which will be described later. As a result, the temperature controllers 213c and 213d are configured to control the temperature of the wafer 200 on the substrate placing surface 211 for each of regions of the wafer 200 by controlling the heaters 213a and 213b (that is, it is possible to perform a "zone control" of the wafer 200). Through-holes 214 penetrated by the lift pins 207 are provided at the substrate support table 212 corresponding to the locations of the lift pins 207.

The substrate support table 212 is supported by a shaft 217. The shaft 217 penetrates a bottom of the process vessel 202. The shaft 217 is connected to an elevating mechanism 218 outside the process vessel 202. The substrate support table 212 may be elevated or lowered by operating the elevating mechanism 218 by elevating or lowering the shaft 217 and the substrate support table 212. A bellows 219 covers a lower end portion of the shaft 217 to maintain the process chamber 201 airtight.

When the wafer 200 is transferred, the substrate support table 212 is lowered until the substrate placing surface 211 of the substrate support table 212 is at a position (height) of the substrate loading/unloading port 1480 (hereinafter referred to as "wafer transfer position"). When the wafer 200 is processed, the substrate support table 212 is elevated until the wafer 200 reaches a processing position in the process chamber 201 (hereinafter referred to as "wafer processing position"). Specifically, when the substrate support table 212 is lowered to the wafer transfer position, the upper ends of the lift pins 207 protrude from an upper surface of the substrate placing surface 211, and the lift pins 207 supports the wafer 200 from thereunder. When the substrate support table 212 is elevated to the wafer processing position, the lift pins 207 are retracted from the upper surface of the substrate placing surface 211 and the substrate placing surface 211 supports the wafer 200 from thereunder. The lift pins 207 may be made of a material such as quartz and alumina since the lift pins 207 are in direct contact with the wafer 200.

<Gas Introduction Port>

A gas introduction port 241 configured to supply various gases into the process chamber 201 is provided (installed) at an upper portion of the process chamber 201. A gas supply mechanism (also referred to as a "gas supply system") connected to the gas introduction port 241 will be described later in detail.

A shower head (also referred to as a "buffer chamber") 234, which includes a dispersion plate 234b configured to evenly disperse a gas supplied through the gas introduction port 241 into the process chamber 201, may be provided in the process chamber 201 that is spatially in communication with the gas introduction port 241.

A matching mechanism 251 and a high frequency power supply 252 are connected to a support portion (also referred to as a "support member") 231b of the dispersion plate 234b and are configured to supply an electromagnetic wave (high frequency power or microwave). The gas supplied into the process chamber 201 through the dispersion plate 234b may be excited (activated) into a plasma state by the electromagnetic wave. That is, the dispersion plate 234b, the support part 231b, the matching mechanism 251 and the high frequency power supply 252 are used to excite a first process gas and a second process gas described later into the plasma state, and serve as a part of a first gas supply mechanism 243 configured to supply the first process gas in the plasma state (which will be described in detail later) and a part of a second gas supply mechanism 244 configured to supply the second process gas in the plasma state (which will be described in detail later).

<Gas Supply Mechanism>

A common gas supply pipe 242 is connected to the gas introduction port 241. A first gas supply pipe 243a, a second gas supply pipe 244a and a third gas supply pipe 245a are connected to the common gas supply pipe 242. The first process gas, which will be described later in detail, is supplied by the first gas supply mechanism (also referred to as a "first gas supply system") 243 which includes the first gas supply pipe 243a. The second process gas, which will be described later in detail, is supplied by the second gas supply mechanism (also referred to as a "second gas supply system") 244 which includes the second gas supply pipe 244a. A purge gas, which will be described later in detail, is supplied by a third gas supply mechanism (also referred to as a "third gas supply system") 245 which includes the third gas supply pipe 245a.

<First Gas Supply Mechanism>

A first gas supply source 243b, a mass flow controller (MFC) 243c serving as a flow rate controller (flow rate control mechanism) and a valve 243d serving as an opening/closing valve are installed at the first gas supply pipe 243a in order from an upstream side to a downstream side of the first gas supply pipe 243a. A gas containing a first element (that is, the first process gas) from the first gas supply source 243*b* is supplied into the process chamber 201 via the first gas supply pipe 243*a* provided with the MFC 243*c* and the valve 243*d* and the common gas supply pipe 242.

For example, a gas containing silicon (Si) element (also referred to as a "silicon-containing gas") may be used as the first process gas. Specifically, a gas such as dichlorosilane ($SiH_2Cl_2$, abbreviated as DCS) gas and tetraethoxysilane ($Si(OC_2H_5)_4$, abbreviated as TEOS) gas may be used as the first process gas. In the following description, the embodiments will be described by way of an example in which the DCS gas is used as the first process gas.

A downstream end of a first inert gas supply pipe 246*a* is connected to the first gas supply pipe 243*a* at a downstream side of the valve 243*d* of the first gas supply pipe 243*a*. An inert gas supply source 246*b*, a mass flow controller (MFC) 246*c* and a valve 246*d* are installed at the first inert gas supply pipe 246*a* in order from an upstream side to a downstream side of the first inert gas supply pipe 246*a*. An inert gas from the inert gas supply source 246*b* is supplied to the first gas supply pipe 243*a* via the first inert gas supply pipe 246*a* provided with MFC 246*c* and the valve 246*d*. For example, nitrogen ($N_2$) gas may be used as the inert gas. Instead of the $N_2$ gas, a rare gas such as argon (Ar) gas, helium (He) gas, neon (Ne) gas and xenon (Xe) gas may be used as the inert gas.

The first gas supply mechanism (also referred to as a "silicon-containing gas supply mechanism") 243, which is one of process gas supply mechanisms, is constituted mainly by the first gas supply pipe 243*a*, the MFC 243*c* and the valve 243*d*. The first gas supply mechanism 243 may further include the first gas supply source 243*b*. A first inert gas supply mechanism (also referred to as a "first inert gas supply system") is constituted mainly by the first inert gas supply pipe 246*a*, the MFC 246*c* and the valve 246*d*. The first inert gas supply mechanism may further include the inert gas supply source 246*b* and the first gas supply pipe 243*a*. In addition, the first gas supply mechanism 243 may further include the first inert gas supply mechanism.

<Second Gas Supply Mechanism>

A second gas supply source 244*b*, a mass flow controller (MFC) 244*c* and a valve 244*d* are installed at the second gas supply pipe 244*a* in order from an upstream side to a downstream side of the second gas supply pipe 244*a*. A gas containing a second element (that is, the second process gas) from the second gas supply source 244*b* is supplied into the process chamber 201 via the second gas supply pipe 244*a* provided with the MFC 244*c* and the valve 244*d* and the common gas supply pipe 242.

The second process gas contains the second element (for example, nitrogen (N)) different from the first element (for example, silicon) contained in the first process gas. For example, a nitrogen-containing gas may be used as the second process gas. For example, ammonia ($NH_3$) gas may be used as the nitrogen-containing gas.

A downstream end of a second inert gas supply pipe 247*a* is connected to the second gas supply pipe 244*a* at a downstream side of the valve 244*d* of the second gas supply pipe 244*a*. An inert gas supply source 247*b*, a mass flow controller (MFC) 247*c* and a valve 247*d* are installed at the second inert gas supply pipe 247*a* in order from an upstream side to a downstream side of the second inert gas supply pipe 247*a*. An inert gas from the inert gas supply source 247*b* is supplied to the second gas supply pipe 244*a* via the second inert gas supply pipe 247*a* provided with the MFC 247*c* and the valve 247*d*. The inert gas supplied through the second inert gas supply pipe 247*a* may be the same as the inert gas of the first inert gas supply mechanism.

The second gas supply mechanism (also referred to as a "nitrogen-containing gas supply mechanism"), which is other one of the process gas supply mechanisms, is constituted mainly by the second gas supply pipe 244*a*, the MFC 244*c* and the valve 244*d*. The second gas supply mechanism 244 may further include the second gas supply source 244*b*. A second inert gas supply mechanism (also referred to as a "second inert gas supply system") is constituted mainly by the second inert gas supply pipe 247*a*, the MFC 247*c* and the valve 247*d*. The second inert gas supply mechanism may further include the inert gas supply source 247*b* and the second gas supply pipe 244*a*. In addition, the second gas supply mechanism 244 may further include the second inert gas supply mechanism.

<Third Gas Supply Mechanism>

A third gas supply source 245*b*, a mass flow controller (MFC) 245*c* and a valve 245*d* are installed at the third gas supply pipe 245*a* in order from an upstream side to a downstream side of the third gas supply pipe 245*a*. An inert gas serving as the purge gas from the third gas supply source 245*b* is supplied into the process chamber 201 via the third gas supply pipe 245*a* provided with the MFC 245*c* and the valve 245*d* and the common gas supply pipe 242.

For example, the nitrogen ($N_2$) gas may be used as the inert gas supplied through the third gas supply pipe 245*a*. Instead of the $N_2$ gas, the rare gas such as argon (Ar) gas, helium (He) gas, neon (Ne) gas and xenon (Xe) gas may be used as the inert gas.

The third gas supply mechanism (also referred to as a "purge gas supply mechanism") 245 is constituted mainly by the third gas supply pipe 245*a*, the MFC 245*c* and the valve 245*d*. The third gas supply mechanism 245 may further include the third gas supply source 245*b*.

<Exhaust Mechanism>

An exhaust port 221 configured to exhaust an inner atmosphere of the process chamber 201 is provided on a surface of an inner wall of the process chamber 201 (the upper vessel 202*a*). An exhaust pipe 224 serving as a first exhaust pipe is connected to the exhaust port 221. Serially connected to the exhaust pipe 224 are: a pressure controller (also referred to as a "pressure regulator") 227 such as an APC (Automatic Pressure Controller) configured to control (adjust) an inner pressure of the process chamber 201; an exhaust control valve 228 serving as a exhaust control part (also referred to as an "exhaust control mechanism") and provided at a preceding stage or a subsequent stage of the pressure controller 227; and a vacuum pump 223.

The pressure controller 227 and the exhaust control valve 228 are configured to control (adjust) the inner pressure of the process chamber 201 in accordance with an instruction from the controller 260 described later when performing the substrate processing described later. More specifically, the pressure controller 227 and the exhaust control valve 228 are configured to control (adjust) the inner pressure of the process chamber 201 by varying opening degrees of the pressure controller 227 and the exhaust control valve 228 in accordance with a process recipe containing information on the sequences and the conditions of the substrate processing described later.

A pressure sensor 229 serving as a pressure measuring device configured to measure an inner pressure of the exhaust pipe 224 is provided at a front stage of the pressure controller 227 (that is, a location closer to the process chamber 201). In addition, the pressure sensor 229 may be configured to measure the inner pressure of the process chamber 201 instead of measuring the inner pressure of the exhaust pipe 224. That is, the pressure sensor 229 may measure the inner pressure of the process chamber 20 or the inner pressure of the exhaust pipe 224 constituting an exhaust mechanism.

The exhaust mechanism (also referred to as an "exhaust system" or an "exhaust line") is constituted mainly by the exhaust port 221, the exhaust pipe 224, the pressure controller 227 and the exhaust control valve 228. The exhaust mechanism may further include the vacuum pump 223 and the pressure sensor 229.

(3) Configuration of Controller of Substrate Processing Apparatus

Figure 3:
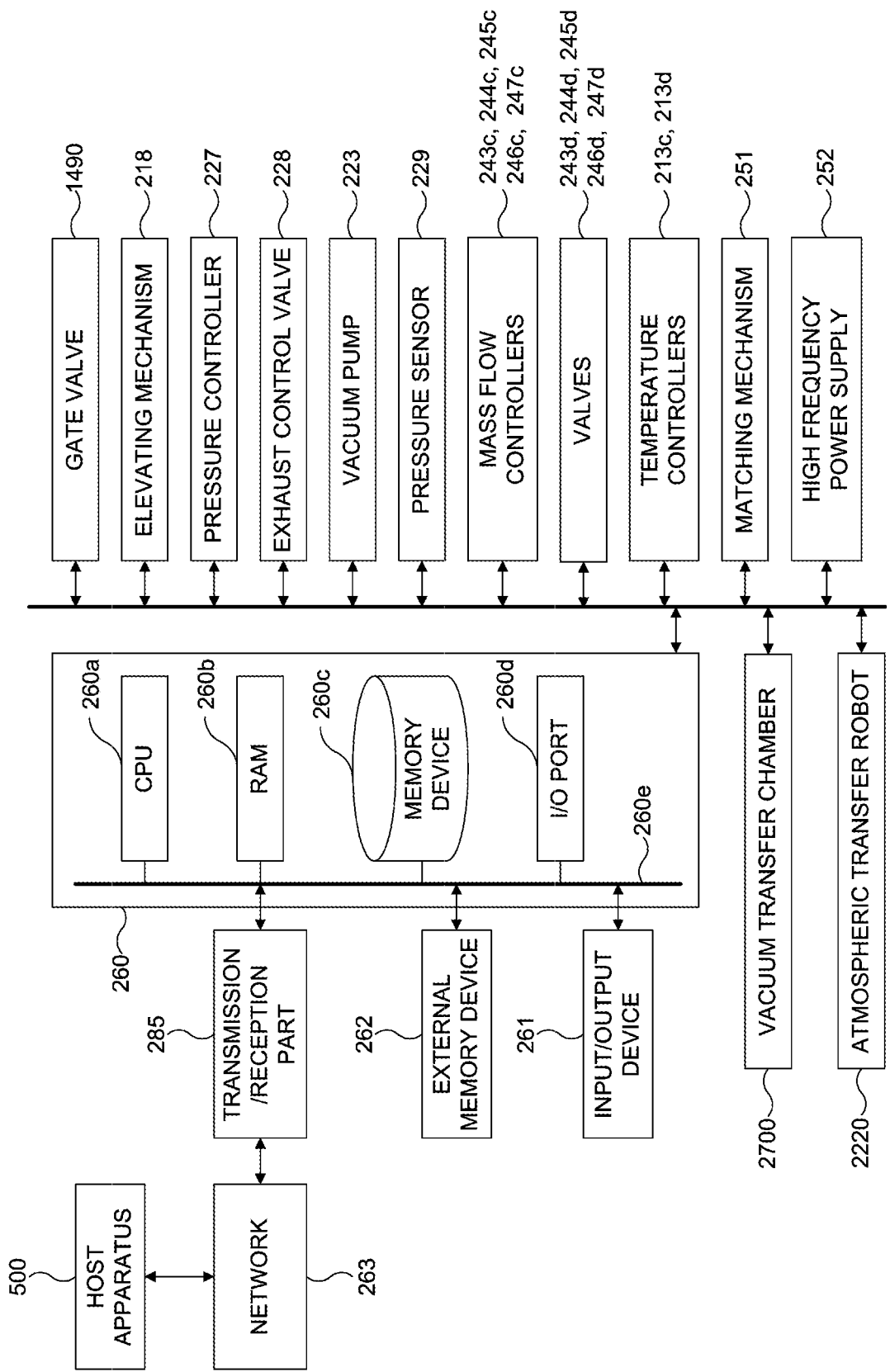
FIG. 3 is a block diagram schematically illustrating a configuration of a controller and related components of the substrate processing apparatus preferably used in the embodiments described herein.

Subsequently, the controller 260 which is a part of the substrate processing apparatus 100 according to the embodiments will be described. FIG. 3 is a block diagram schematically illustrating a configuration of the controller 260 and related components of the substrate processing apparatus 100 preferably used in the embodiments described herein.

<Hardware Configuration of Controller>

The controller 260 functions as a control device (control mechanism) configured to control the operations of the components of the substrate processing apparatus 100 and the operations of the components such as the vacuum transfer robot 2700 of the substrate processing system 2000. As shown in FIG. 3, the controller 260 is constituted by a computer including a CPU (Central Processing Unit) 260a, a RAM (Random Access Memory) 260b, a memory device 260c and an I/O port 260d. The RAM 260b, the memory device 260c and the I/O port 260d may exchange data with the CPU 260a through an internal bus 260e.

For example, the memory device 260c is configured by components such as a flash memory and HDD (Hard Disk Drive). Readably stored in the memory device 260c are: a control program for controlling the operation of the substrate processing apparatus 100; a process recipe containing information on the sequences and conditions of the substrate processing described later; and/or data such as calculation data and processing data generated during performing various processes. The process recipe is obtained by combining steps of the substrate processing described later such that the controller 260 can execute the steps to acquire a predetermine result, and functions as a program.

The RAM 260b functions as a memory area (work area) where a program or the data such as the calculation data and the processing data read by the CPU 260a is temporarily stored.

The I/O port 260d is connected to the components such as the gate valve 1490, the elevating mechanism 218, the pressure controller 227, the exhaust control valve 228, the vacuum pump 223, the pressure sensor 229, the MFCs 243c, 244c, 245c, 246c and 247c, the valves 243d, 244d, 245d, 246d and 247d, the temperature controllers 213c and 213d, the matching mechanism 251, the high frequency power supply 252, the vacuum transfer robot 2700 and the atmospheric transfer robot 2220.

For example, an input/output device 122 such as a touch panel and an external memory device 262 may be connected to the controller 260. In addition, a host apparatus (host computer) 500 serving as a host processor of the substrate processing apparatus 100 may be connected to the controller 260 via a transmission/reception part 285 and a network 263 such as the Internet and a dedicated line. In the present specification, "electrically connected" means that the components are connected by physical electrical cables (signal lines) or the components are in communication with one another to transmit and receive signals (electronic data) to and from one another directly or indirectly.

<Program>

The control program or the process recipe stored in the memory device 260c function as a program executed by the CPU 260a serving as an arithmetic unit. Hereinafter, the control program and the process recipe are collectively referred to as a "program". The process recipe may be simply referred to as a recipe. In the present specification, the term "program" may indicate only the control program, may indicate only the recipe or may indicate both of the control program and the recipe.

The CPU 260a serving as the arithmetic unit is configured to read and execute the program stored in the memory device 260c. The CPU 260a is configured to perform (control) the operation of the substrate processing apparatus 100 according to the contents of the program read from the memory device 260c. For example, the CPU 260a may be configured to control various operations such as an opening and closing operations of the gate valve 1490, an elevating and lowering operation of the elevating mechanism 218, a power supply operation to the temperature controllers 213c and 213d, a power matching operation of the matching mechanism 251, an on/off control operation of the high frequency power supply 252, operations of the MFCs 243c, 244c, 245c, 246c and 247c, on/off control operations of the various gases by the valves 243d, 244d, 245d, 246d and 247d, an operation of adjusting the opening degree of the pressure controller 227, an operation of adjusting the opening degree of the exhaust control valve 228, an on/off control operation of the vacuum pump 223, a control operation of the vacuum transfer robot 2700 and a control operation of the atmospheric transfer robot 2220.

The controller 260 may be embodied by a dedicated computer or by a general-purpose computer. According to the embodiment, for example, the controller 260 may be embodied by preparing the external memory device 262 storing the program and by installing the program onto the general-purpose computer using the external memory device 262. For example, the external memory device 262 may include a magnetic tape, a magnetic disk such as a flexible disk and a hard disk, an optical disk such as a CD and a DVD, a magneto-optical disk such as an MO and a semiconductor memory such as a USB memory and a memory card. The means for providing the program to the computer is not limited to the external memory device 262. For example, the program may be supplied to the computer (general-purpose computer) using communication means such as the Internet and a dedicated line. The memory device 260c or the external memory device 262 may be embodied by a non-transitory computer readable recording medium. Hereafter, the memory device 260c and the external memory device 262 are collectively referred to as the recording medium. In the present specification, the term "recording medium" may refer to only the memory device 260c, may refer to only the external memory device 262 or may refer to both of the memory device 260c and the external memory device 262.

(4) Basic Flow of Substrate Processing

Hereinafter, as a part of manufacturing processes of a semiconductor device, the substrate processing (film-forming process) of forming a predetermined film on the wafer 200 will be described. For example, a silicon nitride film (also referred to as a "SiN film") serving as a nitride film is formed as the predetermined film. The substrate processing described below are performed by the plurality of the substrate processing apparatuses (that is, the substrate processing apparatus 100a, 100b, 100c and 100d) of the substrate processing system 2000 described above. In the following descriptions, the components of the substrate processing apparatus 100 (that is, the substrate processing apparatus 100a, 100b, 100c and 100d) are controlled by the controller 260.

Figure 4:
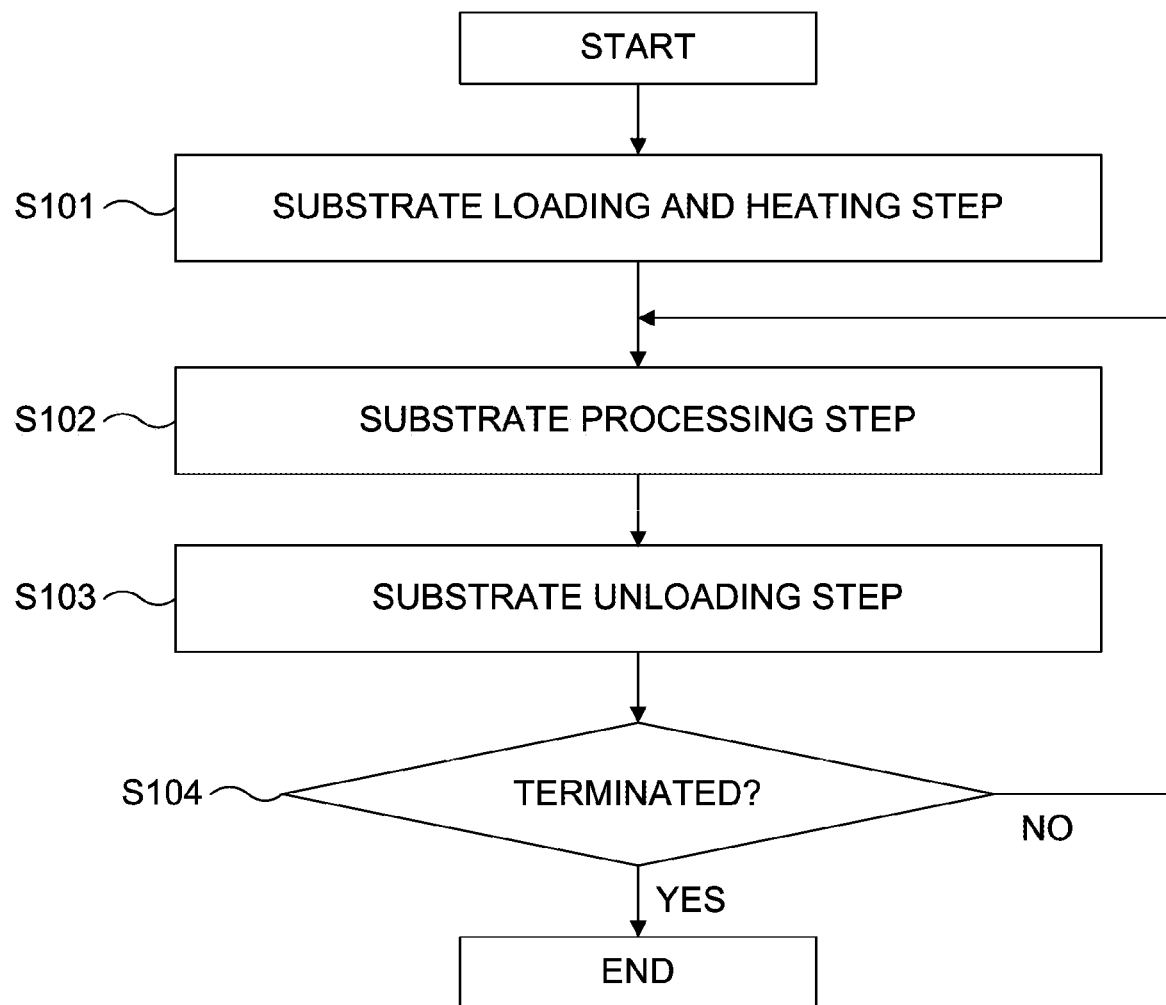
FIG. 4 is a flow chart schematically illustrating a substrate processing according to the embodiments described herein.

FIG. 4 is a flow chart schematically illustrating the substrate processing according to the embodiments described herein.

<Substrate Loading and Heating Step: S101>

When performing the substrate processing, first, in a substrate loading and heating step S101, the unprocessed wafer 200 is taken out of the pod 2001 placed on the I/O stage 2100, and the wafer 200 is loaded (transferred) into the substrate processing apparatus 100 (that is, one of the substrate processing apparatuses 100a, 100b, 100c and 100d). For example, when the substrate processing apparatuses 100a, 100b, 100c and 100d are provided in the substrate processing system 2000, the plurality of the wafers is loaded into each of the substrate processing apparatuses 100a, 100b, 100c and 100d according to a predetermined order. The wafer 200 is taken out of the pod 2001 using the atmospheric transfer robot 2220 provided in the atmospheric transfer chamber 2200, and the wafer 200 is loaded into the substrate processing apparatus 100 using the vacuum transfer robot 2700 provided in the TM 2400. After the wafer 200 is loaded into the substrate processing apparatus 100, the vacuum transfer robot 2700 is retracted to the outside of the substrate processing apparatus 100 and the gate valve (GV) 1490 provided at the substrate processing apparatus 100 is closed to seal the process vessel 202 of the processing apparatus 100. Thereafter, by elevating the substrate support table 212, the wafer 200 on the substrate placing surface 211 is moved to the wafer processing position described above. While the wafer 200 is at the wafer processing position, the exhaust mechanism (the exhaust system) is controlled so that the inner pressure of the process chamber 201 is adjusted to and maintained at a predetermined pressure, and the heaters 213a and 213b are controlled so that a surface temperature of the wafer 200 reaches and is maintained at a predetermined temperature.

<Substrate Processing Step: S102>

Subsequently, when the wafer 200 positioned (located) at the wafer processing position reaches the predetermined temperature, a substrate processing step S102 is performed. In the substrate processing step S102, the wafer 200 is in a heated state at the predetermined temperature while the first gas supply mechanism 243 is controlled to supply the first gas into the process chamber 201, the exhaust mechanism is controlled to exhaust the process chamber 201, and the wafer 200 is processed. In the substrate processing step S102, a CVD process may be performed by controlling the second gas supply mechanism 244 so that the second gas is present in the process space 201 (that is, the process chamber 201) simultaneously with the first gas, or a cyclic process may be performed by controlling the second gas supply mechanism 244 so that the first gas and the second gas are alternately supplied into the process chamber 201. When supplying the second gas in the plasma state, the second gas may be activated into the plasma state in the process chamber 201 by supplying the high-frequency power to the dispersion plate 234b.

The cyclic process, which is a specific example of a film processing method, will be described with reference to the following example. For example, the DCS gas may be used as the first gas and the NH$_3$ gas may be used as the second gas. When the DCS gas and the NH$_3$ gas is used, the DCS gas is supplied to the wafer 200 in a first step of the substrate processing step S102, and the NH$_3$ gas is supplied to the wafer 200 in a second step of the substrate processing step S102. A purging step of the substrate processing step S102 of supplying the N$_2$ gas and exhausting the inner atmosphere of the process chamber 201 is performed between the first step and the second step. The silicon nitride film (SiN film) is formed on the wafer 200 by performing the cyclic process in which the first step, the purging step and the second step are performed a plurality of times.

<Substrate Unloading Step: S103>

After a predetermined process is performed to the wafer 200 by the substrate processing step S102, in a substrate unloading step S103, the processed wafer 200 is transferred (unloaded) out of the process vessel 202 of the substrate processing apparatus 100. For example, the processed wafer 200 is unloaded out of the process vessel 202 using the arm 2900 of the vacuum transfer robot 2700 provided in the TM 2400.

In the substrate unloading step S103, for example, when the unprocessed wafer 200 is supported (held) by the arm 2800 of the vacuum transfer robot 2700, the unprocessed wafer 200 is loaded into the process vessel 202 by the vacuum transfer robot 2700. As described later in a determination step S104, the substrate processing step (S102) is performed to the unprocessed wafer 200 in the process vessel 202. When the unprocessed wafer 200 is not supported by the arm 2800, only the processed wafer 200 is unloaded in the substrate unloading step S103.

After the processed wafer 200 is unloaded by the vacuum transfer robot 2700, the processed wafer 200 is transferred to and stored in the pod 2001 placed on the I/O stage 2100 by using the vacuum transfer robot 2700 provided in the atmospheric transfer chamber 2200.

<Determination Step: S104>

In the substrate processing system 2000, the substrate processing step S102 and the substrate unloading step S103 are repeatedly performed until no unprocessed wafer 200 remains. When there is no unprocessed wafer 200, the substrate processing, that is the steps S101 through S104 is terminated.

(5) Overview of Maintenance Process

Subsequently, a maintenance process of the substrate processing apparatus 100 in the substrate processing system 2000 described above will be described.

In the substrate processing system 2000, the plurality of the wafers including the wafer 200 is handled as one unit (that is, a "lot") when the substrate processing is performed by the substrate processing apparatus 100 (that is, each of the substrate processing apparatuses 100a, 100b, 100c and 100d). For example, the plurality of the wafers (for example, 25 wafers) stored in the pod 2001 may be handled as one lot. Alternatively, for example, the plurality of the wafers including the wafer 200 stored in a predetermined number of pods including the pod 2001 may be handled as one lot.

Figure 5:
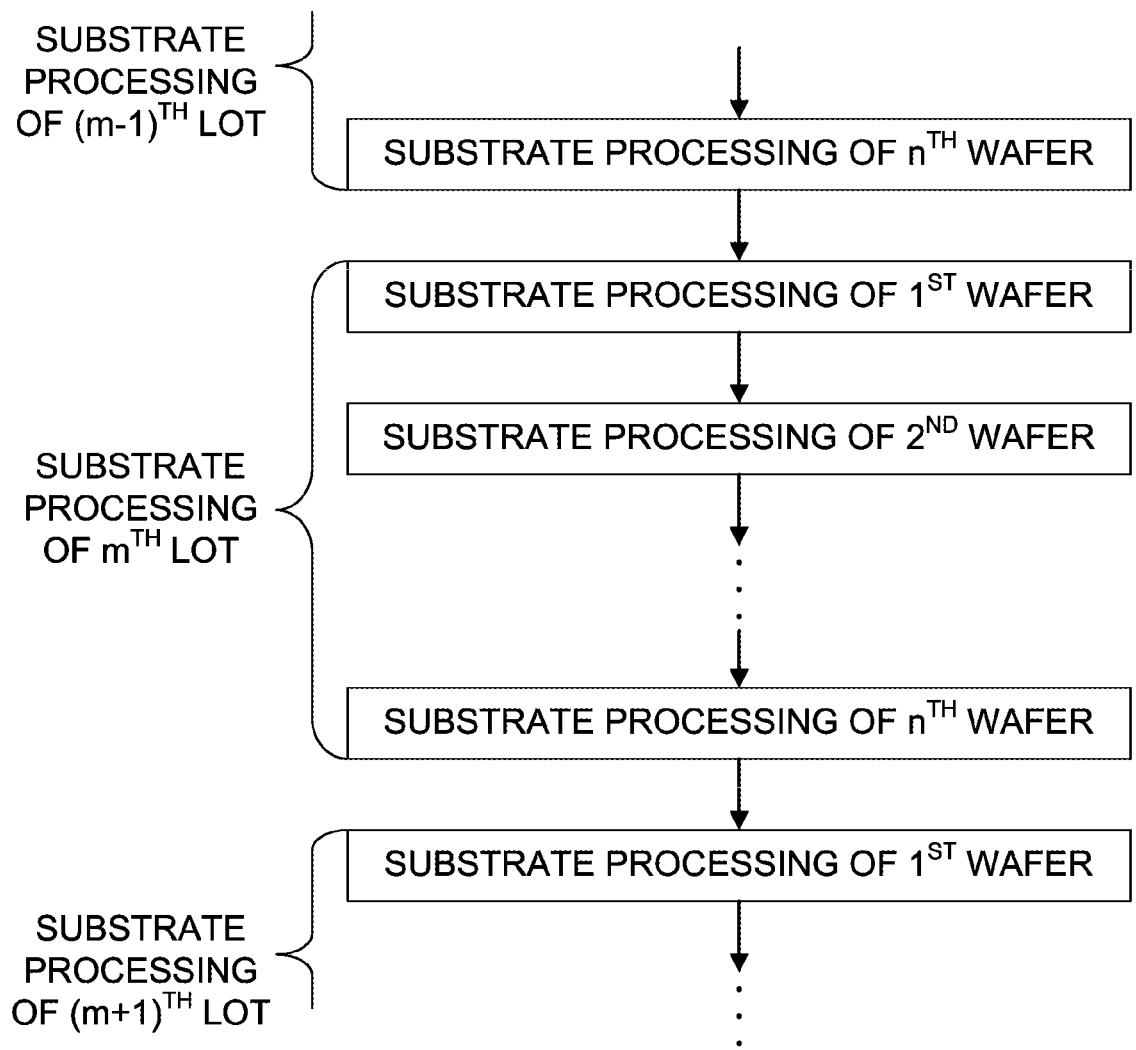
FIG. 5 is a flow chart schematically illustrating an exemplary sequence of processing a plurality of substrates pursuant to a sequential order.

When the plurality of the wafers including the wafer 200 is handled as one lot, the substrate processing apparatus 100 sequentially performs the substrate processing on each of the plurality of the wafers constituting the lot. FIG. 5 is a flow chart schematically illustrating an exemplary sequence of processing the plurality of the substrates pursuant to a sequential order. Specifically, as shown in FIG. 5, the substrate processing apparatus 100 starts the substrate processing of an $m^{th}$ lot from the first wafer of the $m^{th}$ lot (m is a natural number greater than 2). Then, the substrate processing of each of the plurality of the wafers constituting the $m^{th}$ lot is sequentially repeated until the substrate processing of the n$^{th}$ wafer of the m$^{th}$ lot is completed (n is a natural number). When the substrate processing of all the plurality of the wafers in the m$^{th}$ lot is completed, the substrate processing is performed again in the same manner for the next lot, that is, an (m+1)$^{th}$ lot.

When the substrate processing is repeatedly performed on the plurality of the wafers including the wafer 200 as described above, in the substrate processing apparatus 100, an unnecessary film such as reaction by-products may be deposited in the process vessel 202. Therefore, a maintenance process of cleaning the substrate processing apparatus 100 may be performed at a predetermined maintenance timing. The maintenance timing is determined based on conditions at least one among the number of processed wafers, a thickness of an accumulated film including or excluding the unnecessary film such as the reaction by-products and an accumulated process time of the substrate processing.

However, when the plurality of the wafers including the wafers 200 is handled as one lot, the processing quality of each of the plurality of the wafers may be affected depending on the timing of the maintenance process (that is, the maintenance timing). For example, when the maintenance process is interposed in the middle of the substrate processing of a certain lot, the processing conditions may be changed before and after the maintenance process, and the processing quality of the plurality of the wafers may vary in the same lot. In addition, for example, when an execution of the maintenance process is postponed too much in order to meet the processing conditions, the appropriate timing of the maintenance process may be missed, which may adversely affect the processing quality of the plurality of the wafers in the same lot. Further, for example, when the timing of performing the maintenance process is decided by a personnel such as a maintenance operator, the burden on the maintenance operator may become excessive, and there is no guarantee that the maintenance timing can be appropriately decided.

Therefore, in the substrate processing system 2000 according to the embodiments, in order to optimize the timing of performing the maintenance process (that is, the maintenance timing) by the substrate processing apparatus 100 (that is, the substrate processing apparatuses 100*a*, 100*b*, 100*c* and 100*d*), the controller 260 has a characteristic functional configuration described below, and performs a characteristic control process described below according to the functional configuration. Hereinafter, the characteristic functional configuration and the characteristic control process will be described in detail.

(6) Characteristic Functional Configuration of Controller

Figure 6:
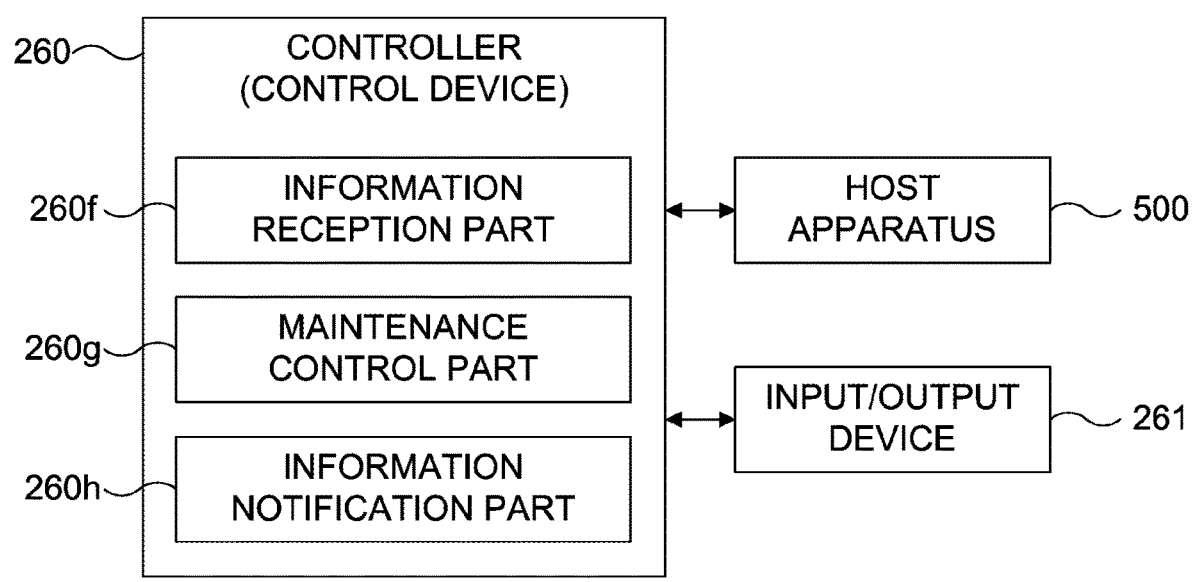
FIG. 6 is a block diagram schematically illustrating an exemplary functional configuration of the controller of the substrate processing apparatus preferably used in the embodiments described herein.

FIG. 6 is a block diagram schematically illustrating an exemplary functional configuration of the controller 260 of the substrate processing apparatus 100 preferably used in the embodiments described herein. As shown in FIG. 6, the controller 260 may function as an information reception part (also referred to as an "information receiver") 260*f*, a maintenance control part (also referred to as a "maintenance controller") 260*g* and an information notification part (also referred to as an "information notifier") 260*h* when the CPU 260*a* executes a program read from the memory device 260*c*.

The information reception part 260*f* has a function of receiving maintenance reservation information. The maintenance reservation information is reservation information of performing the maintenance process of the process vessel 202 provided in the substrate processing apparatus 100 (that is, each of the substrate processing apparatuses 100*a*, 100*b*, 100*c* and 100*d*), in particular, the maintenance process of the process chamber 201 defined by the process vessel 202. The maintenance reservation information may be individually set for each of the substrate processing apparatuses 100*a*, 100*b*, 100*c* and 100*d*. For example, the maintenance reservation information is provided by the host apparatus 500 at a predetermined maintenance timing. The host apparatus 500 determines whether or not the maintenance timing has come based on the conditions of at least one among the number of wafers processed by the substrate processing apparatus 100 (that is, each of the substrate processing apparatuses 100*a*, 100*b*, 100*c* and 100*d*), the thickness of the accumulated film and the accumulated process time of the substrate processing. However, the maintenance reservation information is not necessarily provided by the host apparatus 500. For example, the maintenance reservation information may be provided by the personnel such as the maintenance operator through the input/output device 261 such as a touch panel attached to each of the substrate processing apparatuses 100*a*, 100*b*, 100*c* and 100*d*.

The maintenance control part 260*g* has a function of controlling the timing of performing the maintenance process reserved by the maintenance reservation information when the information reception part 260*f* receives the maintenance reservation information. A specific example of a timing control of the maintenance process (that is, a control of the timing of performing the maintenance process) will be described later in detail.

The information notification part 260*h* has a function of the receiving maintenance reservation information from the information reception part 260*f* and performing a notification that the maintenance process is reserved when the information reception part 260*f* receives the maintenance reservation information. The notification by the information notification part 260*h* is performed by, for example, displaying the notification using a display of the input/output device 261 such as the touch panel attached to the substrate processing apparatus 100 for which the maintenance process is reserved. However, the notification by the information notification part 260*h* is not limited thereto. For example, the notification by the information notification part 260*h* may be performed by transmitting data (that is, data indicating the notification) to the host apparatus 500.

(7) Characteristic Control Process of Maintenance Timing

Subsequently, specific control modes of the timing control of the maintenance process performed using the functional configuration will be described above with reference to FIG. 8. FIG. 8 is a table schematically illustrating control modes according to the embodiments described herein.

<First Control Mode>

First, a first control mode will be described. FIG. 7 is a flowchart schematically illustrating an exemplary control process of the maintenance timing according to the embodiments described herein.

Assume that, for example as shown in FIG. 7, the maintenance reservation information is issued for the substrate processing apparatus 100 (that is, one of the substrate processing apparatuses 100*a*, 100*b*, 100*c* and 100*d*) during the substrate processing of each of the plurality of the wafers including the wafer 200 of the m$^{th}$ lot (that is, before the substrate processing of the n$^{th}$ wafer 200 in the m$^{th}$ lot is completed). For example, when at least one of the conditions such as the number of wafers processed by the substrate processing apparatus 100 (that is, each of the substrate processing apparatuses 100*a*, 100*b*, 100*c* and 100*d*), the thickness of the accumulated film and the accumulated process time of the substrate processing exceeds a predetermined allowable value, the host apparatus 500 or the input/output device 261 determines that the substrate processing apparatus 100 has reached the maintenance timing, and issues the maintenance reservation information regardless of the status of the substrate processing by the substrate processing apparatus 100. When the maintenance reservation information is issued by the host apparatus 500 or the input/output device 261, the maintenance reservation information is received by the information reception part 260f.

When the information reception part 260f receives the maintenance reservation information, the maintenance control part 260g controls the substrate processing apparatus 100 to continuously perform the substrate processing after the maintenance reservation information is received until the substrate processing performed by the substrate processing apparatus 100 is completed, more specifically, until the substrate processing of the $n^{th}$ wafer 200 in the $m^{th}$ lot being processed is completed. That is, the substrate processing apparatus 100 continuously performs the substrate processing until the substrate processing of all of the plurality of the wafers including the wafer 200 constituting the lot being processed (that is, the $m^{th}$ lot) is completed. Therefore, for example, when the plurality of the wafers including the 200 stored in the pod 2001 is handled as one lot, the substrate processing apparatus 100 continuously performs the substrate processing until the substrate processing of all of the plurality of the wafers stored in the pod 2001 is completed.

After the information reception part 260f receives the maintenance reservation information, the information notification part 260h receives the maintenance reservation information and notifies (that is, performs the notification) that the maintenance process is reserved. Accordingly, the maintenance operator who operates the input/output device 261 or a system administrator who is an operator of the host apparatus 500 (hereinafter, simply referred to as "a personnel such as the maintenance operator and the system administrator") can recognize that the maintenance process is reserved according to the maintenance reservation information.

When the substrate processing of all of the plurality of the wafers including the wafer 200 constituting the lot being processed is completed, then, the maintenance control part 260g controls the components of the substrate processing apparatus 100 to store all of the processed wafers including the wafer 200 in the pod 2001, to stop the transfer of the next wafer to be processed (that is, the first wafer in the $(m+1)^{th}$ lot into the substrate processing apparatus 100, and to set the inside of the process vessel 202 in the substrate processing apparatus 100 (in particular, the inside of the process chamber 201) to a state capable of performing the maintenance process (also referred to as a "maintenance enable state").

The term "maintenance enable state" refers to a state that the operation of the substrate processing apparatus 100 is stopped, the process vessel 202 of the substrate processing apparatus 100 can be opened to the atmosphere and the maintenance process such as the cleaning process can be performed to the inside of the process vessel 202 (particularly, the inside of the process chamber 201).

As described above, according to the first control mode, there arises a time lag (time difference) sufficient to complete the substrate processing being processed. That is, the time difference between the reception of the maintenance reservation information for the substrate processing apparatus 100 and the substrate processing apparatus 100 entering into the maintenance enable state. Therefore, it is possible to issue the maintenance reservation information by the host apparatus 500 or the input/output device 261 at a desired timing. Even when the maintenance reservation information is issued at a desired timing, it is possible to prevent, for example, the substrate processing from being interrupted (stopped) in the middle of processing of a certain lot. In addition, even when the maintenance reservation information is issued at a desired timing, the substrate processing apparatus 100 automatically enters into the maintenance enable state at a predetermined timing thereafter.

Therefore, according to the first control mode, it is possible to prevent the processing quality of the plurality of the wafers including the wafer 200 from varying within the same lot regardless of the timing of issuing the maintenance reservation information. In addition, for example, it is possible to avoid adversely affecting the processing quality of the plurality of the wafers without delaying the execution of the maintenance process too much and losing the appropriate timing of the maintenance process. It is also possible to suppress the burden on the personnel such as the maintenance operator and the system administrator, which is very convenient for them. That is, according to the first control mode, it is possible to optimize the timing of performing the maintenance process by the substrate processing apparatus 100. In the substrate processing system 2000 provided with the plurality of the substrate processing apparatuses (that is, the substrate processing apparatuses 100a, 100b, 100c and 100d), it is possible to improve the operation rate of the substrate processing system 2000 by optimizing the timing of performing the maintenance process. That is, it is possible to improve the manufacturing throughput of the semiconductor device in the substrate processing system 2000.

<Second Control Mode>

Hereinafter, a second control mode will be described. In the following description, the differences between the second control mode and the first control mode described above will be mainly described.

After the maintenance reservation information is received, according to the first control mode, the substrate processing by the substrate processing apparatus 100 is continuously performed until the substrate processing of all of the plurality of the wafers including the wafer 200 is completed. However, according to the second control mode, the number of wafers to be continuously processed in accordance with the substrate processing by the substrate processing apparatus 100 is determined depending on the number of unprocessed wafers in the lot being processed.

For example, assume that the plurality of the wafers (for example, 25 wafers) including the wafer 200 stored in the pod 2001 is handled as one lot. Then, when the number of the unprocessed wafers in the lot is equal to or less than, for example, half of the number of the plurality of wafers stored in the lot, the maintenance control part 260g controls the substrate processing apparatus 100 to continuously perform the substrate processing until the substrate processing of all of the plurality of the wafers in the lot being processed is completed. However, when the number of the unprocessed wafers in the lot is greater than, for example, half of the number of the plurality of wafers stored in the lot, it is expected that it will take a long time to process the unprocessed wafers in the lot. Therefore, in that case the maintenance control part 260g controls the substrate processing apparatus 100 to enter into the maintenance enable state after the substrate processing of a predetermined number of wafers (for example, at least one wafer being processed) is completed without waiting for the completion of the substrate processing of all of the plurality of wafers including the wafers 200 in the lot. In other words, for example, when 25 wafers including the wafer 200 stored in the pod 2001 is handled as one lot, the number of about 10 to 13, which is almost half of the number of the wafers in the pod 2001, is set as a threshold value for the determination criteria. Then, the number of wafers to be continuously processed in accordance with the substrate processing by the substrate processing apparatus 100 is changed (determined) depending on whether or not the number of the unprocessed wafers is equal to or less than the threshold value when the maintenance reservation information is received.

As described above, according to the second control mode, the number of wafers to be continuously processed in accordance with the substrate processing by the substrate processing apparatus 100 may be changed (determined) according to the number of unprocessed wafers in the lot being processed when the maintenance reservation information is received. Therefore, for example, when the number of the unprocessed wafers is small, the substrate processing is continuously performed until the substrate processing of all of the plurality of the wafers including the wafer 200 is completed. As a result, it is possible to prevent the processing quality of the plurality of wafers including the wafer 200 from varying within the same lot. On the other hand, for example, when the number of the unprocessed wafers is large, it is possible to quickly start the maintenance process by setting substrate processing apparatus 100 to the maintenance enable state without waiting for the completion of the substrate processing of all of the plurality of the wafers in the lot.

Therefore, according to the second control mode, it is possible to adjust the timing of performing the maintenance process flexibly according to the number of the unprocessed wafers in the lot being processed when the maintenance reservation information is received. As a result, it is possible to better optimize the timing of performing the maintenance process by the substrate processing apparatus 100.

<Third Control Mode>

Hereinafter, a third control mode will be described. In the following description, the differences between the third control mode and the first control mode or the second control mode described above will be mainly described.

As described above, according to the first control mode or the second control mode, when the maintenance reservation information is received, the substrate processing apparatus 100 enters into the maintenance enable state at a predetermined timing after the substrate processing of the lot being processed is continuously performed. However, even after the maintenance reservation information is issued, it may be necessary to advance or delay the timing of the maintenance process for some reason. In this regard, according to the third control mode, a change in the maintenance timing within a predetermined range may be accepted (recognized), wherein the maintenance timing is a timing at which the substrate processing apparatus 100 enters into the maintenance enable state according to the maintenance reservation information.

For example, after the maintenance reservation information is received, the maintenance control part 260g receives instruction information to advance the maintenance process from the host apparatus 500 or the input/output device 261 before the substrate processing apparatus 100 enters into the maintenance enable state. That is, a change in the timing of the maintenance process is received so as to advance the timing of the maintenance process at which the substrate processing apparatus 100 enters into the maintenance enable state. More specifically, in order to advance the timing of shifting to the maintenance enable state, the maintenance control part 260g controls the substrate processing apparatus 100 such that at least the substrate processing of a wafer being processed by the substrate processing apparatus 100 at the time when the instruction information is received is completed, and a wafer being transferred by the vacuum transfer robot 2700 or the atmospheric transfer robot 2220 is stored again in the pod 2001. When the wafer mentioned above is stored in the pod 2001, the substrate processing apparatus 100 enters into the maintenance enable state prior to the original timing (for example, prior to the timing at which the substrate processing of the lot being processed is completed).

For example, after the maintenance reservation information is received, the maintenance control part 260g receives instruction information to delay the maintenance process from the host apparatus 500 or the input/output device 261 before the substrate processing apparatus 100 enters into the maintenance enable state. In this case, the maintenance timing is delayed. More specifically, in order to delay the timing of shifting to the maintenance enable state, the maintenance control part 260g controls the substrate processing apparatus 100 such that the substrate processing apparatus 100 does not enter into the maintenance enable state at the original timing (for example, the timing at which the substrate processing of the lot being processed is completed), and the substrate processing of a plurality of wafers stored in the next lot is performed by the substrate processing apparatus 100. Instead, the substrate processing apparatus 100 enters into the maintenance enable state after waiting for the substrate processing of all the wafers of the next lot (for example, $(m+1)^{th}$ lot) to be completed.

As described above, according to the third control mode, the change of the maintenance timing within the predetermined range may be received even after the maintenance reservation information is received. Therefore, when necessary for some reason, it is possible to advance or delay the timing of the maintenance process even after the maintenance reservation information is issued and the maintenance process is reserved by the maintenance reservation information.

Therefore, according to the third control mode, it is possible to change the timing of performing the maintenance process as necessary, which is very convenient for the personnel such as the maintenance operator and the system administrator. In addition, since the change of the timing of the maintenance process can be managed properly, it is possible to better optimize the timing of the maintenance process.

It is preferable that the change of the timing is accepted only within the predetermined range. The predetermined range may be set in advance appropriately, for example, based on conditions of at least one among the number of the wafers processed by the substrate processing apparatus 100 (that is, each of the substrate processing apparatuses 100a, 100b, 100c and 100d), the thickness of the accumulated film and the accumulated process time of the substrate processing and combinations thereof. When the change is limited within the predetermined range, it is possible to prevent the timing of the maintenance process from being changed unboundedly, and as a result, it is possible to suppress the adverse effects due to the change of the timing. That is, it is preferable that the change of the timing is limited within such range as to cause no adverse effects.

<Fourth Control Mode>

Hereinafter, a fourth control mode will be described. In the following description, the differences between the fourth control mode and the first control mode through the third control mode described above will be mainly described.

For example, there may be some cases where the maintenance process reserved by the maintenance reservation information becomes unnecessary for some reason even after the maintenance reservation information is issued. In this regard, according the fourth control mode, a cancellation of the maintenance reservation information may be accepted (recognized) after the maintenance reservation information is received.

More specifically, after the maintenance reservation information is received, the maintenance control part 260g receives instruction information to cancel the maintenance reservation information from the host apparatus 500 or the input/output device 261 before the substrate processing apparatus 100 enters into the maintenance enable state. That is, the cancellation of the maintenance reservation information is accepted so as to cancel the maintenance reservation information. Then, the maintenance control part 260g cancels the maintenance reservation information and controls the substrate processing apparatus 100 such that the substrate processing apparatus 100 does not enter into the maintenance enable state at the original timing (for example, the timing at which the substrate processing of the lot being processed is completed), and the substrate processing of a plurality of wafers stored in the next lot (for example, $(m+1)^{th}$ lot) is performed by the substrate processing apparatus 100.

As described above, according to the fourth control mode, the cancellation of the maintenance reservation information may be accepted even after the maintenance reservation information is received. Therefore, it is possible to manage appropriately even when the maintenance process becomes unnecessary. Therefore, according to the fourth control mode, it is possible to cancel the maintenance reservation information as necessary, and it is also possible to operate the system (that is, the substrate processing system 2000) flexibly and appropriately.

<Fifth Control Mode>

Hereinafter, a fifth control mode will be described. In the following description, the differences between the fifth control mode and the first control mode through the fourth control mode described above will be mainly described.

According to the fifth control mode, when the maintenance reservation information is received, the time required for the substrate processing apparatus 100 to enter into the maintenance enable state by completing the substrate processing of the substrate processing apparatus 100 is notified.

Specifically, when the maintenance reservation information is received, the maintenance control part 260g identifies the timing of the substrate processing apparatus 100 entering into the maintenance enable state and calculates the required time for the substrate processing apparatus 100 to enter into the maintenance enable state. The required time may be calculated using a well-known technique. When the maintenance control part 260g calculates the required time, the information notification part 260h notifies the input/output device 261 or the host apparatus 500 of the calculation result of the required time.

As described above, according to the fifth control mode, the required time for the substrate processing apparatus 100 to enter into the maintenance enable state may be notified. As a result, the personnel such as the maintenance operator and the system administrator can easily and accurately recognize when the maintenance process can be performed. Therefore, according to the fifth control mode, it is very convenient for the personnel such as the maintenance operator and the system administrator. In addition, it is possible to better optimize the timing of performing the maintenance process by the substrate processing apparatus 100, and it is also possible to operate the system (that is, the substrate processing system 2000) appropriately.

<Sixth Control Mode>

Hereinafter, a sixth control mode will be described. In the following description, the differences between the sixth control mode and the first control mode through the fifth control mode described above will be mainly described.

According to the third control mode, as described above, the change of the timing of the maintenance process is received after the maintenance reservation information is received. However, according to the sixth control mode, when the maintenance reservation information is issued, the maintenance timing may be designated (set) as desired according to the maintenance reservation information. To that end, the maintenance reservation information may include parameter information configured to designate the timing at which the substrate processing apparatus 100 enters into the maintenance enable state.

For example, when it is desired to immediately perform the maintenance process, the maintenance control part 260g receives the maintenance reservation information including the parameter information indicating that the maintenance process should be immediately performed. Then, the maintenance control part 260g that has received the maintenance reservation information controls the substrate processing apparatus 100 such that the substrate processing of the wafer being processed by the substrate processing apparatus 100 is completed at the timing when the information is received and that the substrate processing apparatus 100 enters into the maintenance enable state thereafter. In addition, when it is desired to perform the maintenance process after the substrate processing of a plurality of lots is continued, the maintenance control part 260g receives the maintenance reservation information including the parameter information indicating that the maintenance process should be performed after the substrate processing of the plurality of the lots is continued. Then, the maintenance control part 260g that has received the maintenance reservation information controls the substrate processing apparatus 100 such that the substrate processing apparatus 100 continuously performs the substrate processing until the substrate processing of the plurality of the lots is completed, and that the substrate processing apparatus 100 enters into the maintenance enable state after the substrate processing of the plurality of the lots is completed.

As described above, according to the sixth control mode, it is possible to designate the maintenance timing as desired in accordance with the parameter information included in the maintenance reservation information. Therefore, according to the sixth control mode, it is possible to perform the maintenance process at a timing desired by the personnel such as the maintenance operator and the system administrator, which is very convenient for them. In addition, it is possible to better optimize the timing of performing the maintenance process by the substrate processing apparatus 100, and it is also possible to operate the system (that is, the substrate processing system 2000) appropriately.

<Seventh Control Mode>

Hereinafter, a seventh control mode will be described. In the following description, the differences between the seventh control mode and the first control mode through the sixth control mode described above will be mainly described.

According to the first control mode through the sixth control modes described above, it is assumed that the plurality of the wafers including the 200 in the same lot is continuously processed by the same substrate processing apparatus among the plurality of the substrate processing apparatuses (that is, one of the substrate processing apparatuses 100a, 100b, 100c and 100d). According to the seventh control mode, the substrate processing is performed using the plurality of the substrate processing apparatuses (that is, two or more of the substrate processing apparatuses 100a, 100b, 100c and 100d) connected to the TM 2400. That is, the substrate processing is distributed to, for example, each of the substrate processing apparatuses 100a, 100b, 100c and 100d.

For example, when the maintenance reservation information for a certain substrate processing apparatus among the plurality of the substrate processing apparatuses, for example, the maintenance reservation information for the substrate processing apparatus 100a, is received, the maintenance control part 260g controls the substrate processing apparatus 100a such that the substrate processing being performed by the substrate processing apparatus 100a is continued. In addition, when there is an unprocessed wafer in the same lot as that of the wafer being processed by the substrate processing apparatus 100a, the maintenance control part 260g controls the components such as the vacuum transfer robot 2700 such that the unprocessed wafer is transferred to one of the substrate processing apparatuses 100b, 100c and 100d that has not received the maintenance reservation information. Then, the substrate processing of the unprocessed wafer is performed by the one of the substrate processing apparatuses 100b, 100c and 100d to which the unprocessed wafer is transferred. That is, it is possible to assign the substrate processing of the unprocessed wafer in the same lot as that of the wafer being processed by the substrate processing apparatus 100a to another of the substrate processing apparatuses 100b, 100c and 100d that has not received the maintenance reservation information. Referring to the substrate processing system 2000 shown in FIG. 1, for example, when the maintenance reservation information is received by the substrate processing apparatus 100a among the substrate processing apparatuses 100a, 100b, 100c and 100d, the maintenance control part 260g controls the substrate processing apparatuses 100a, 100b, 100c and 100d such that the substrate processing being performed by the substrate processing apparatuses 100b, 100c and 100d is continued and that the substrate processing apparatus 100a is set to an offline state after the substrate processing of the wafer being processed by the substrate processing apparatus 100a is completed.

According to the seventh control mode, as described above, it is possible to distribute the substrate processing of the unprocessed wafers to each of the plurality of the substrate processing apparatuses that has not received maintenance reservation information. Therefore, according to the seventh control mode, it is possible to shorten the time required from the reception of the maintenance reservation information to start of the maintenance process as compared with a case where the substrate processing is not distributed, and it is also possible to operate the system (that is, the substrate processing system 2000) efficiently.

(8) Effects of the Embodiments

According to the embodiments described above, it is possible to provide at least one or more of the following effects.

(a) According to some control modes described in the embodiments, after the maintenance reservation information is received, the substrate processing by the substrate processing apparatus 100 related to the maintenance reservation information is continuously performed, and the substrate processing apparatus 100 enters into the maintenance enable state after the substrate processing is completed. Therefore, when the plurality of the wafers including the 200 is handled as one lot, the processing quality of each of the plurality of the wafers including the wafer 200 is not adversely affected even if the maintenance reservation information is issued at a desired timing. It is also possible to suppress the burden on the personnel such as the maintenance operator and the system administrator, and it is also possible to optimize the timing of performing the maintenance process by the substrate processing apparatus 100.

(b) According to some control modes described in the embodiments, when the plurality of the wafers including the 200 stored in the pod 2001 is handled as one lot, the substrate processing apparatus 100 continuously performs the substrate processing until the substrate processing of all of the plurality of the wafers stored in the pod 2001 is completed after the maintenance reservation information is received. Therefore, it is possible to prevent the processing quality of the plurality of the wafers in the pod 2001 from varying within the same lot regardless of the timing of issuing the maintenance reservation information. It is advantageous in that the embodiments may be applied when the plurality of the wafers including the 200 is handled as one lot in unit of the pod 2001.

(c) According to some control modes described in the embodiments, the number of wafers to be continuously processed in accordance with the substrate processing by the substrate processing apparatus 100 may be changed according to the number of unprocessed wafers in the lot being processed at the time when the maintenance reservation information is received. Therefore, it is possible to change the timing of performing the maintenance process flexibly. As a result, it is possible to better optimize the timing of performing the maintenance process by the substrate processing apparatus 100.

(d) According to some control modes described in the embodiments, when the maintenance reservation information is received, a notification that the maintenance process is reserved is performed. Accordingly, the personnel such as the maintenance operator and the system administrator can recognize that the maintenance process is reserved according to the maintenance reservation information. Therefore, it is very convenient for the personnel such as the maintenance operator and the system administrator.

(e) According to some control modes described in the embodiments, even after the maintenance reservation information is received, it is possible to accept a change of the maintenance timing within the predetermined range. Therefore, it is possible to change the timing of performing the maintenance process as necessary, which is very convenient for the personnel such as the maintenance operator and the system administrator. In addition, since the change of the maintenance timing can be managed properly, it is possible to better optimize the timing of the maintenance process.

(f) According to some control modes described in the embodiments, even after the maintenance reservation information is received, the cancellation of the maintenance reservation information may be received. Therefore, it is possible to cancel the maintenance reservation information as necessary, and it is also possible to operate the system flexibly and appropriately.

(g) According to some control modes described in the embodiments, after the maintenance reservation information is received, the time required for the substrate processing apparatus 100 to enter into the maintenance enable state by completing the substrate processing is notified. Therefore, it is very convenient for the personnel such as the maintenance operator and the system administrator. In addition, it is possible to better optimize the timing of performing the maintenance process, and it is also possible to operate the system appropriately.

(h) According to some control modes described in the embodiments, the maintenance reservation information may include the parameter information designating the timing at which the substrate processing apparatus 100 enters into the maintenance enable state. Therefore, it is possible to perform the maintenance process at a timing desired by the personnel such as the maintenance operator and the system administrator, which is very convenient for them. In addition, it is possible to better optimize the timing of performing the maintenance process, and it is also possible to operate the system appropriately.

OTHER EMBODIMENTS

While the technique is described by way of the above-described embodiments, the above-described technique is not limited thereto. The above-described technique may be modified in various ways without departing from the gist thereof.

For example, while the embodiments are described by way of an example in which the film is formed by alternately supplying the first gas and the second gas, the above-described technique is not limited thereto. The above-described technique may also be applied to a substrate processing in which one kind of the gas is supplied to form the film.

For example, while the embodiments are described by way of an example in which the SiN film is formed on the surface of the wafer using the silicon-containing gas as the source gas and the nitrogen-containing gas as the reactive gas, the above-described technique is not limited thereto. The above-described technique may be applied to form other films using different gases. For example, the above-described technique may also be applied to form an oxygen-containing film, a nitrogen-containing film, a carbon-containing film, a boron-containing film and a metal-containing film and a film containing at least two among silicon (Si), oxygen (O), nitrogen (N), carbon (C), boron (B), aluminum (Al), zirconium (Zr), hafnium (Hf) and titanium (Ti). That is, the above-described technique may also be applied to from a film such as an AlO film, a ZrO film, a HfO film, a HfAlO film, a ZrAlO film, a SiC film, a SiCN film, a SiBN film, a TiN film, a TiC film and a TiAlC film.

For example, while the embodiments are described by way of an example in which a film-forming process is performed as the substrate processing, the above-described technique is not limited thereto. The above-described technique may be applied to other processes. For example, the above-described technique may also be applied to a diffusion process using plasma, an oxidation process, a nitridation process, an oxynitridation process, a reduction process, an oxidation-reduction process, an etching process and a heating process. The above-described technique may also be applied to a plasma oxidation process or a plasma nitridation process of a film formed on a substrate or a surface of the substrate using only the reactive gas. The above-described technique may also be applied to a plasma annealing process using only the reaction gas. After performing the above-described processes as a first process, the above-described substrate processing may be performed as a second process.

While the embodiments are described by way of an example in which a substrate processing apparatus capable of processing one substrate in one process chamber is used, the above-described technique is not limited thereto. The above-described technique may be applied to other substrate processing apparatuses such as a substrate processing apparatus capable of processing a plurality of substrates arranged horizontally or vertically.

While the embodiments are described by way of an example in which the substrate processing is performed as a part of the manufacturing processes of the semiconductor device, the above-described technique is not limited thereto. The above-described technique may be applied to other manufacturing processes. For example, the above-described techniques may be applied to a manufacturing process of a liquid crystal device, a manufacturing process of a solar cell, a manufacturing process of a light emitting device, a manufacturing process of a glass substrate, a manufacturing process of a ceramic substrate and a manufacturing process of a conductive substrate.

As described above, according to some embodiments in the present disclosure, it is possible to optimize a timing of a maintenance process.

What is claimed is:

1. A method of manufacturing a semiconductor device comprising:
    (a) transferring a substrate from a storage container storing one or more substrates including the substrate to a process chamber, and performing a substrate processing;
    (b) receiving maintenance reservation information of the process chamber; and
    (c) continuously performing the substrate processing after the maintenance reservation information is received in (b) until the substrate processing in the process chamber related to the maintenance reservation information is completed, stopping the one or more substrates from being transferred into the process chamber, and thereafter setting the process chamber to a maintenance enable state;
    (d) performing a notification that a maintenance process is reserved after the maintenance reservation information is received in (b); and
    (e) accepting a change in a maintenance timing within a predetermined range, wherein the maintenance timing is a timing when the process chamber enters into the maintenance enable state according to the maintenance reservation information,
    wherein the change is to advance the maintenance timing, and the maintenance timing is advanced at least by completing a currently proceeding substrate processing in the process chamber and withdrawing a currently transferring substrate so as to be stored again in the storage container.

2. The method of claim 1, wherein, after the maintenance reservation information is received in (b), the substrate processing in the process chamber is continuously performed until the substrate processing of all of the one or more substrates stored in the storage container is completed.

3. The method of claim 2, wherein the maintenance reservation information comprises parameter information designating the maintenance timing.

4. The method of claim 1, wherein, after the maintenance reservation information is received in (b), number of substrates to be continuously subject to the substrate processing in the process chamber is determined depending on number of unprocessed substrates stored in the storage container.

5. The method of claim 4, wherein the maintenance reservation information comprises parameter information designating the maintenance timing.

6. The method of claim 1, wherein the notification is performed by displaying the notification by a substrate processing apparatus comprising the process chamber.

7. The method of claim 6, wherein the maintenance reservation information comprises parameter information designating the maintenance timing.

8. The method of claim 1, wherein the notification is performed by transmitting data indicating the notification to a host apparatus configured to manage the substrate processing in the process chamber.

9. The method of claim 1, wherein, in case of delaying the maintenance timing, the substrate processing of a next substrate in the process chamber is performed without setting the process chamber to the maintenance enable state until a delayed maintenance timing comes.

10. The method of claim 1, further comprising
   (f) accepting a cancellation of the maintenance reservation information.

11. The method of claim 1, further comprising
   (g) notifying a time required for the process chamber to enter into the maintenance enable state by completing the substrate processing in the process chamber after the maintenance reservation information is received in (b).

12. The method of claim 1, wherein the maintenance reservation information comprises parameter information designating the maintenance timing.

* * * * *